United States Patent
Kim

(10) Patent No.: US 7,070,379 B2
(45) Date of Patent: Jul. 4, 2006

(54) SEMICONDUCTOR FABRICATION APPARATUS HAVING FOUP INDEX IN APPARATUS INSTALLATION AREA

(75) Inventor: Ki-Sang Kim, Kyunggi-do (KR)

(73) Assignee: Samsung Elctronics Co., Ltd., Suwon-si (KR)

( * ) Notice: Subject to any disclaimer, the term of this patent is extended or adjusted under 35 U.S.C. 154(b) by 207 days.

(21) Appl. No.: 10/154,609

(22) Filed: May 22, 2002

(65) Prior Publication Data

US 2002/0182790 A1   Dec. 5, 2002

(30) Foreign Application Priority Data

Jun. 1, 2001   (KR) ............................... 2001-30819

(51) Int. Cl.
 *B65G 49/07* (2006.01)
(52) U.S. Cl. ..................... 414/217.1; 414/937; 414/939
(58) Field of Classification Search ............. 414/217.1, 414/937, 939, 941; 206/711; 220/826
See application file for complete search history.

(56) References Cited

U.S. PATENT DOCUMENTS

| | | | | |
|---|---|---|---|---|
| 5,390,785 A | * | 2/1995 | Garric et al. ............. | 206/213.1 |
| 5,562,383 A | * | 10/1996 | Iwai et al. ................ | 414/217.1 |
| 5,975,834 A | * | 11/1999 | Ogawa et al. ........... | 414/744.5 |
| 6,068,668 A | * | 5/2000 | Mastroianni ................ | 29/25.01 |
| 6,079,927 A | * | 6/2000 | Muka .......................... | 414/217 |
| 6,318,953 B1 | * | 11/2001 | Bonora et al. .............. | 414/754 |
| 6,425,722 B1 | * | 7/2002 | Ueda et al. .................. | 414/217 |
| 6,485,250 B1 | * | 11/2002 | Hofmeister .............. | 414/744.1 |
| 6,519,504 B1 | * | 2/2003 | Soraoka et al. ............. | 700/228 |
| 6,632,068 B1 | * | 10/2003 | Zinger et al. ............... | 414/800 |
| 6,729,824 B1 | * | 5/2004 | Lei et al. ..................... | 417/217 |
| 6,860,965 B1 | * | 3/2005 | Stevens ................. | 156/345.32 |

FOREIGN PATENT DOCUMENTS

| | | | |
|---|---|---|---|
| JP | 2000-188316 | * | 7/2000 |
| JP | 2002-83855 | * | 3/2002 |

* cited by examiner

Primary Examiner—James W. Keenan
(74) Attorney, Agent, or Firm—Marger Johnson & McCollom, P.C.

(57) ABSTRACT

A semiconductor fabrication apparatus, located in an apparatus installation area, includes a front-opening unified pod (FOUP) index, a plate, a first transfer device, a second transfer device, and an engineering FOUP index and multiple processing chambers. The FOUP index can be located in a line, vertically, horizontally, on top, and on bottom. The engineering FOUP index is used for manually locating the FOUP thereon in case of processing irregular single wafers that are not stored in a lot. As the FOUP index is located in the semiconductor fabrication apparatus installed in the apparatus installation area, dead space between the apparatus and air eddies generated above and below the FOUP index can be eliminated to increase the efficiency of working area and improve the environment in fabrication.

6 Claims, 8 Drawing Sheets

SEMICONDUCTOR FABRICATION APPARATUS HAVING FOUP INDEX IN APPARATUS INSTALLATION AREA

RELATED APPLICATION

This application claims priority to Korean Patent Application No. 2001-30819, filed on Jun. 1, 2001, which is incorporated by reference.

BACKGROUND OF THE INVENTION

The present invention relates to a semiconductor fabrication apparatus and, more particularly, to such an apparatus having a front opening unified pod (FOUP) index in an apparatus installation area.

Generally, a semiconductor fabrication apparatus includes a FOUP for storing and transferring wafers, a FOUP index on which the FOUP is placed, a transfer chamber, a loadlock chamber, a loader, and processing chambers. The transfer chamber has a transfer device in order to transfer wafers in the FOUP to the loadlock chamber. Wafers are loaded or unloaded after a door of the FOUP is opened.

In case of transferring or processing semiconductor wafers, the ambient environment should be very clean. Thus, wafers are transferred by being inserted into a very clean FOUP.

Referring to FIGS. 1–3, a FOUP 100 is placed on a plate 90 on the FOUP index 10 by an automated guided vehicle (AGV) robot 70. A door of the FOUP 100 is opened by a robot arm system 110. That is, when the door of the FOUP 100 is stuck to the robot arm system 110 by key grooves of the robot arm system 110, the robot arm system 110 moves downward to open the door of the FOUP. Wafers in the FOUP 100 are transferred to a loadlock chamber 30 by a transfer device in a transfer chamber 20, and then sent to a processing chamber 50 by another transfer device in a loader 40. The finished wafers are stored into a FOUP in an inverse operation.

In a conventional semiconductor fabrication apparatus where the FOUP index 10 protrudes into the working area defined by the partition 80, the AGV robot 70 can, while moving, load and unload the FOUP 100 on the plate 90 on the FOUP index 10.

Because of the FOUP index 10 protrudes into the working area, however, there are several problems with this approach. A dead space 60 in which operators cannot work is formed between adjacent apparatus, thereby decreasing the use of space in fabrication. The width of the working area also is inefficiently increased. Further, because of a transfer module such as a transfer chamber and a loadlock chamber, the process becomes complicated. Also, undesirable air eddies are generated above and below the FOUP index 10 in the working area in accordance with conventional configurations.

SUMMARY OF THE INVENTION

The semiconductor fabrication apparatus disclosed herein improves the fabrication area environment and efficiency by locating a FOUP index in the semiconductor fabrication apparatus that does not protrude toward the working area. The apparatus further simplifies the fabrication process by eliminating a transfer module such as a transfer chamber and a loadlock chamber.

In a clean room composed of a working area and an apparatus installation area demarcated by a partition, a semiconductor fabrication apparatus is located in the apparatus installation area. The semiconductor fabrication apparatus has FOUP indexes, multiple processing chambers and transfer devices. A FOUP is loaded or unloaded on the FOUP index by an AGV robot. Wafers are placed in the FOUP on the FOUP index and transferred into the processing chamber by the transfer device for processing.

In the present apparatus, the indexes can be linearly arranged, horizontally or vertically. A first transfer device transfers wafers in the FOUP to a second transfer device and the finished wafers are transferred in an inverse order. The second transfer device transfers wafers between the first transfer device and the processing chamber and includes multiple arms generally C-shaped and a base. Those skilled in the art will appreciate that such a general C-shape characterizes a front elevational view of the arms 230 of FIGS. 5A and 5B.

The arm is composed of a top strut, a bottom strut, a pivot, and a hand for simultaneously loading and unloading wafers in the processing chamber by opening the processing chamber. The arms comprise a first arm and a second arm. The first arm is jointed at the base, and the second arm is jointed at the same base and located upwardly from the first arm. The second arm further surrounds the struts of the first arm.

The semiconductor fabrication apparatus further includes an engineering FOUP index on which a FOUP can be manually placed for processing single wafers that are not stored in a lot.

In the present invention, the FOUP index has a plate adapted to transport the FOUP thereon. The FOUP index includes two guard pins. The guard pin contacts with the edge of the door to open the door when the plate moves forward.

The FOUP has a door and can include an elastic body that enables a door to rotate. Thus, the doors can be opened and closed. The door is a folding type that is automatically opened and shut by contact with the guard pin. The elastic body is a spring that has a restoring force with respect to rotation.

According to the present semiconductor fabrication apparatus, as the FOUP is located in the semiconductor fabrication apparatus installed in the apparatus installation area. Air eddies generated are thereby not generated in the working area above and below the FOUP index, improving the fabrication environment. The size of the working area is thereby decreased and area efficiency is increased. The dead space is eliminated so as to permit operators to approach the space between adjacent apparatus. The process can be further simplified by the transfer device described herein.

DESCRIPTION OF THE PREFERRED EMBODIMENT

The present apparatus is described more fully hereinafter with reference to the accompanying drawings, in which preferred embodiments of the invention are shown. The same reference numbers indicate the same components throughout the specification.

Figure 1:
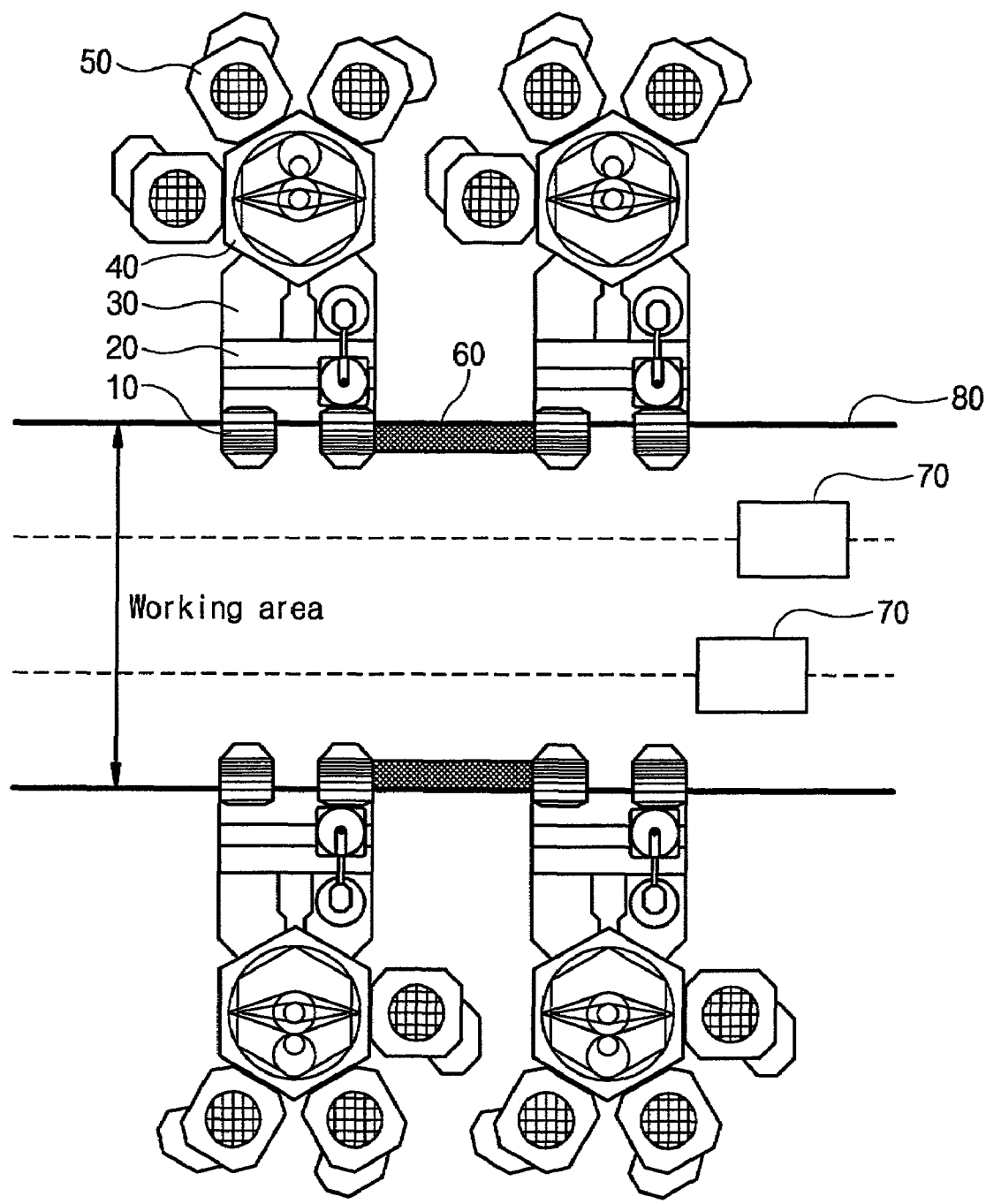
FIG. 1 is a diagram illustrating the relation between a working area and a conventional semiconductor fabrication apparatus having FOUP indexes protruded into the working area.
Figure 2:
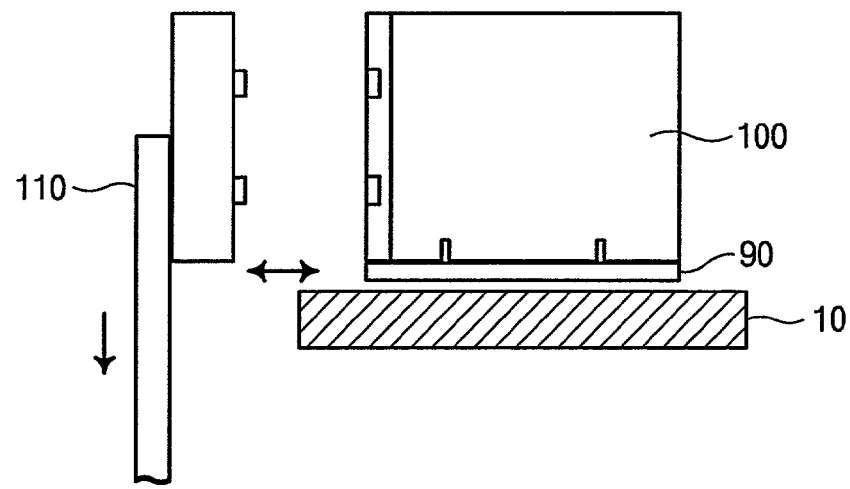
FIG. 2 is a diagram of the opening and shutting of a door of a conventional FOUP.
Figure 3:
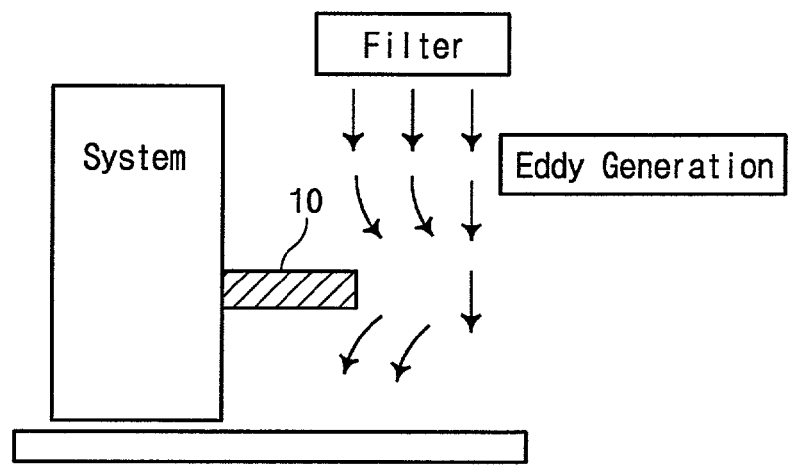
FIG. 3 is a diagram of a side view of a conventional semiconductor fabrication apparatus.
Figure 4:
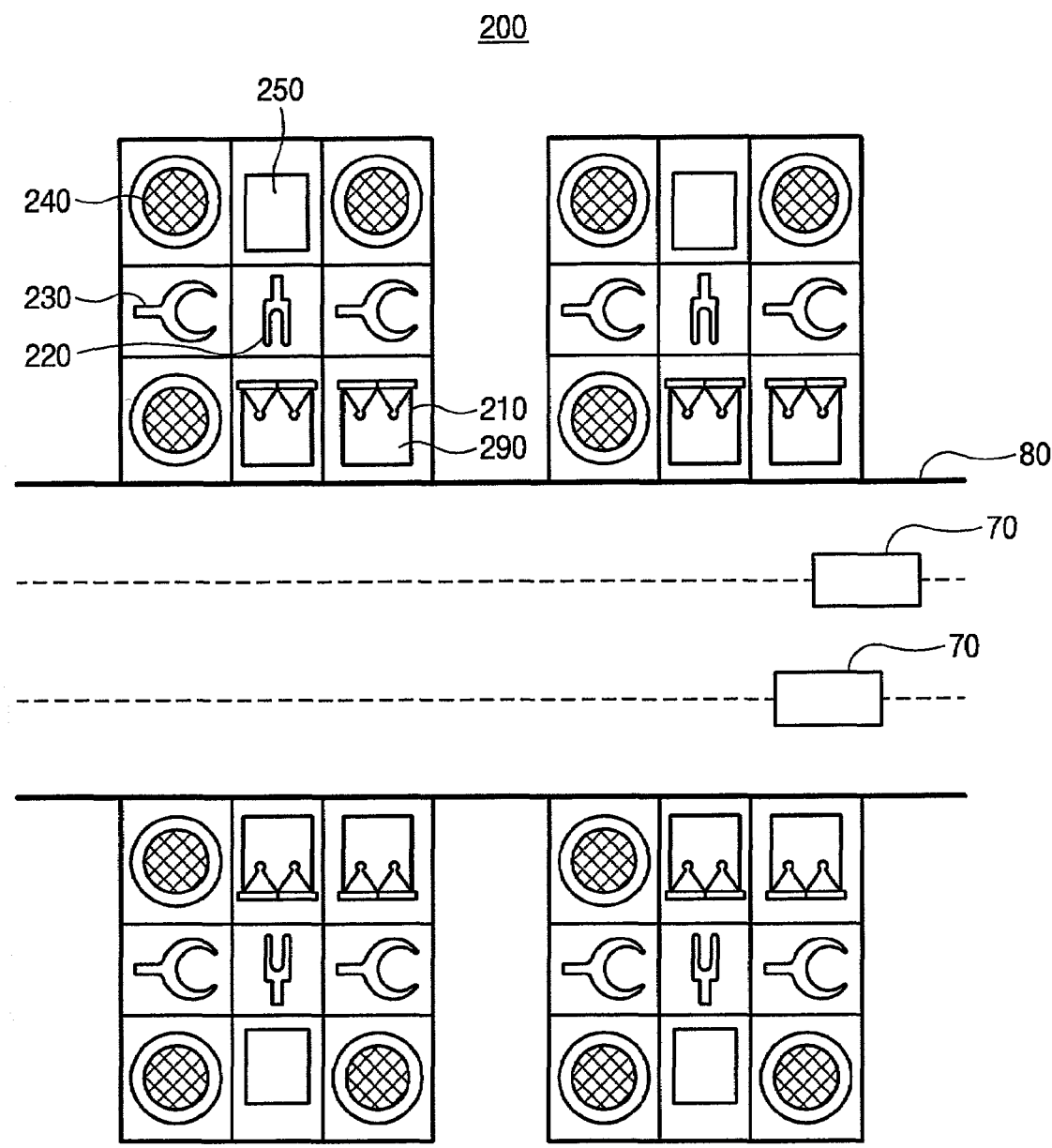
FIG. 4 is a schematic diagram illustrating the relation between a working area and a semiconductor fabrication apparatus by which FOUP indexes are located in the apparatus installation area according to the present invention.
Figure 5A:
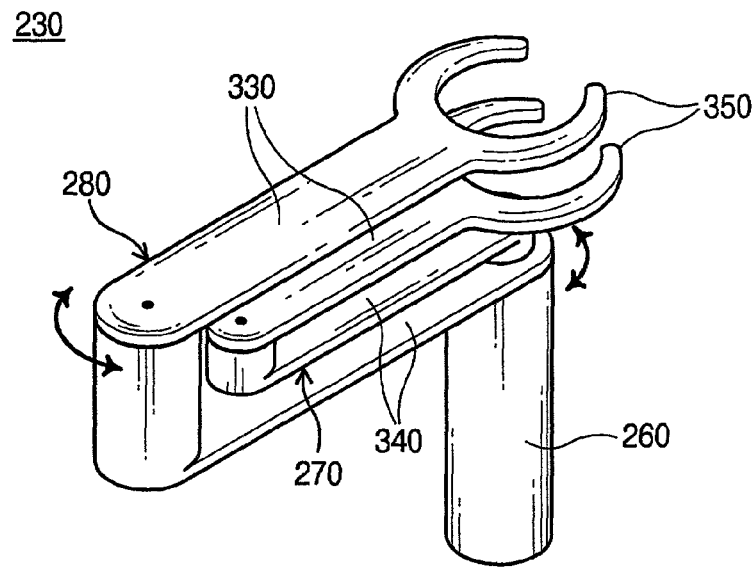
FIGS. 5A and 5B show a second transfer device operative to load or unload wafers in a processing chamber respectively, in stowed and displayed position.
Figure 5B:
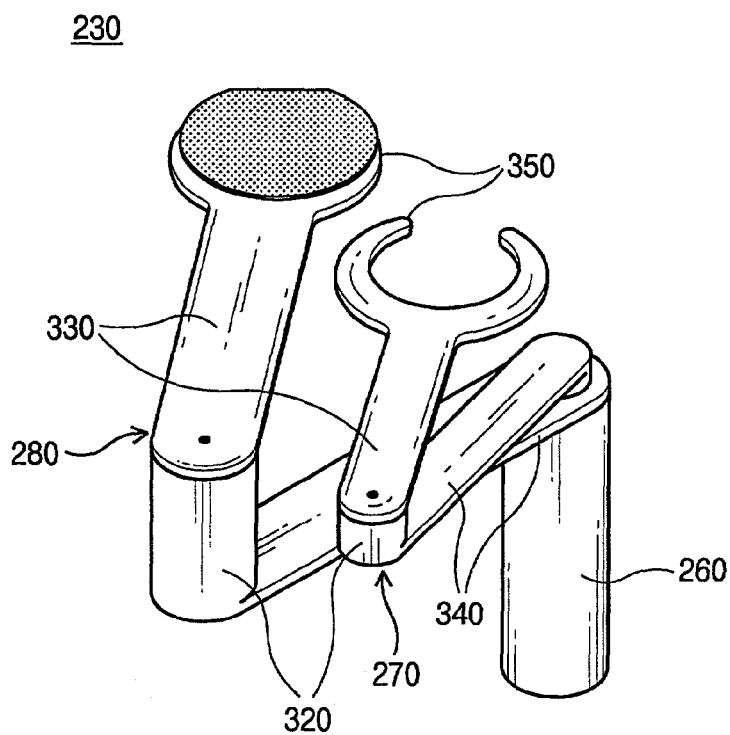
Figure 6:
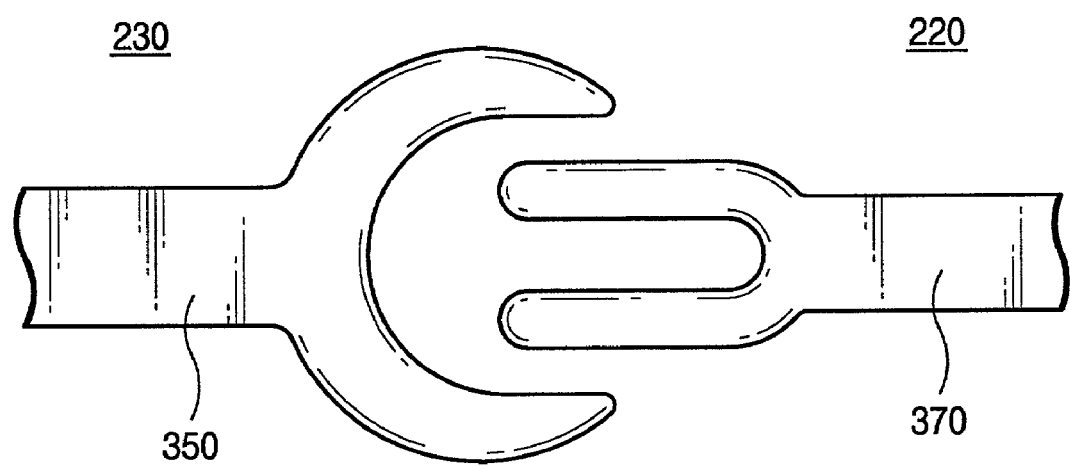
FIG. 6 is a diagram illustrating hands of a first transfer device and a second transfer device.

Referring to FIGS. 4–6, a semiconductor fabrication apparatus 200 includes a FOUP index 210, a processing chamber 240, a first transfer device 220 and a second transfer device 230.

The semiconductor fabrication apparatus 200 is located in the apparatus installation area divided by a partition 80. The FOUP index 210 is located in the semiconductor fabrication apparatus 200. Wafers are put in a FOUP 290 and the FOUP 290 is put on the FOUP index 210 by an AGV robot 70. The wafers in the FOUP 290 are transferred to the second transfer device 230 by the first transfer device 220, and the second transfer device 230 transfers the wafers to a processing chamber 240. Wafers are processed at the processing chamber 240 and the finished wafers are transferred in an inverse operation and stored in the FOUP 290.

The first transfer device replaces a conventional transfer module and can move horizontally and vertically and rotate for at least about 360°. In the present embodiment, a conventional transfer module is removed between the first transfer device 220 and the second transfer device 230. Thus, the wafers are directly transferred between the two transfer devices. Two hands 350 and 370 of the transfer devices for receiving wafers are made as exemplified in FIG. 6, wherein the two hands do not interfere with each other. In the embodiment as illustrated, the hand 350 of the second transfer device 230 surrounds the hand 370 of the first transfer device 220.

The second transfer device 230 is located proximate the processing chamber 240. The semiconductor fabrication apparatus 200 has at least one second transfer device 230. The second transfer device 230 is operative to transfer wafers between the first transfer device 220 and the processing chamber 240. The second transfer device can have multiple arms. Thus, during one opening of the processing chamber 240, the second transfer device 230 can simultaneously unload and load a plurality of wafers from and to the processing chamber 240.

Referring to FIGS. 5A and 5B, the arm is composed of a base 260, a first arm 270 and a second arm 280. The first arm 270 and second arm 280 are jointed at the base 260 and can rotate. The first and second arms comprise top struts 330, bottom struts 340, pivots 320 and hands 350. The pivot 320 is vertically jointed between the top strut 330 and bottom strut 340 so that the top and bottom struts can rotate. In the illustrated embodiment, the pivot 320 joining the second transfer arm 280 and the first arm 270 is a nested cylinder design, wherein an outer sleeve is made diametrically larger to surround an inner sleeve. Alternatively, a vertical rod type of pivot can be employed.

The second arm 280 is located over the first arm 270 and surrounds the struts of the first arm. The first arm 270 unloads finished wafers in the processing chamber 240 to the hand 350. When the first arm 270 returns to the original position, the second arm 280, having on the hand 350 thereof a wafer to be processed, loads the wafer into the processing chamber 240. The wafers are placed on the hand 350 of the first arm 270 and the other wafers are placed on the other hand 350 of the second arm 280 to be transferred. Because of the second transfer device 230, it is possible to substantially simplify the wafer fabrication process.

The semiconductor fabrication apparatus 200 includes an engineering FOUP index 250, on which the FOUP 290 can be manually placed for processing single pieces of wafers that are not stored in a lot. The engineering FOUP index 250 is located between the processing chambers 240 of the back part of the semiconductor fabrication apparatus 200.

Additionally, the semiconductor fabrication apparatus has multiple processing chambers, transfer devices and FOUP indexes as described in FIG. 4. The processing chambers 240 are preferably located at each corner on the lay-out of the semiconductor fabrication apparatus and process wafers identically. By properly utilizing space, multiple processing chambers are installed in the semiconductor fabrication apparatus to increase production quantity. The lay-out is not defined only as shown in FIG. 4 but can be modified into various forms, within the spirit and scope of the invention.

Figure 7:
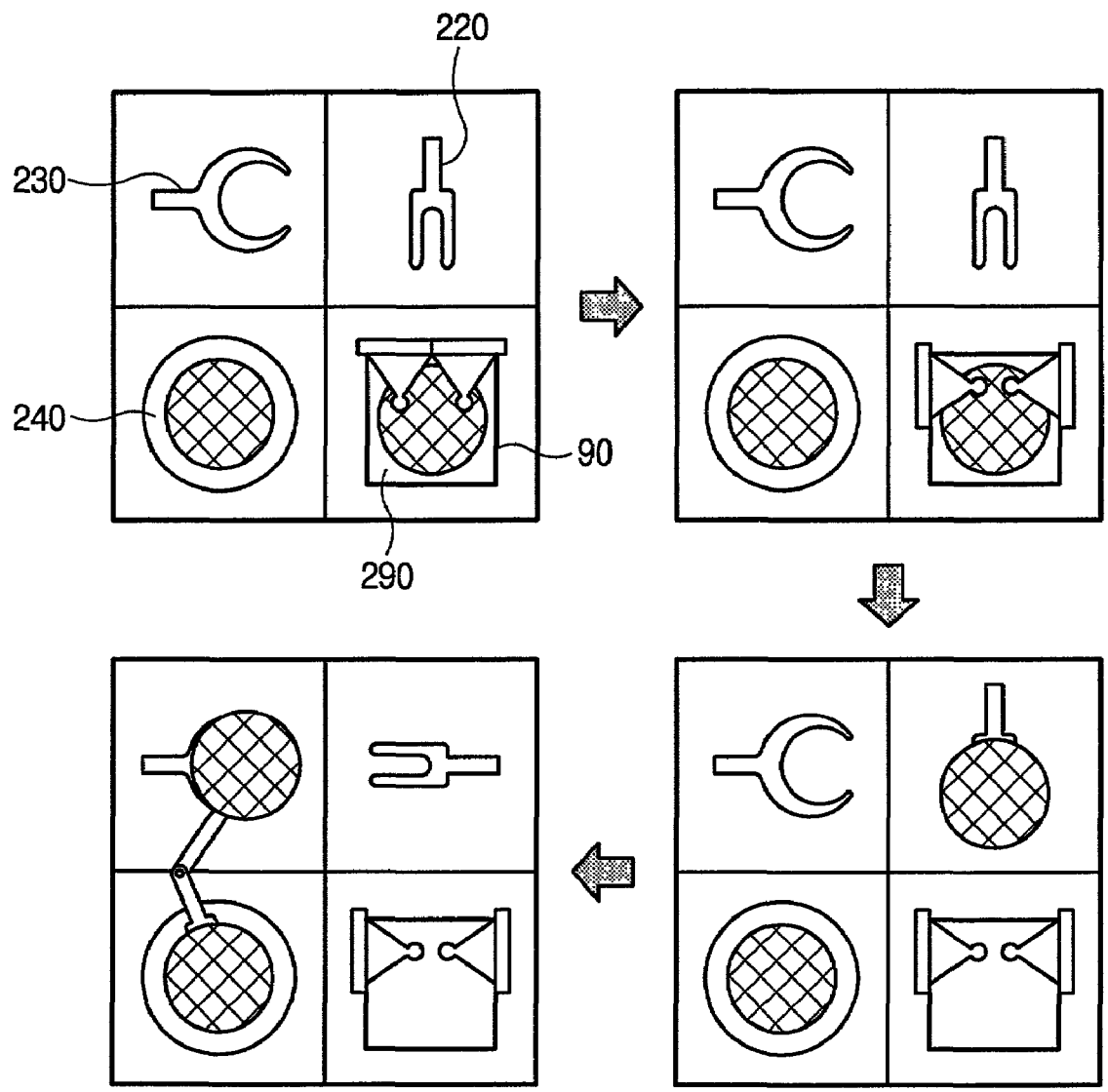
FIG. 7 is a schematic diagram for illustrating the operation procedure of the semiconductor fabrication apparatus for processing wafers.
Figure 8A:
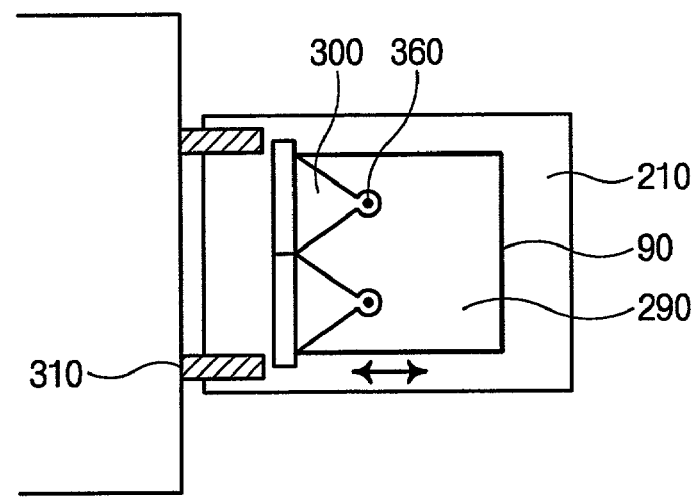
FIGS. 8A and 8B illustrate the closing and opening respectively, of a door of a FOUP of a folding type.
Figure 8B:
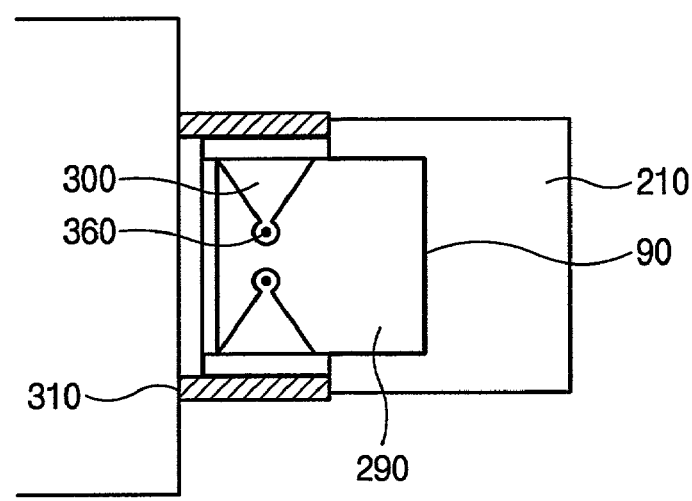

Referring to FIGS. 7–8, the process for processing wafers in the semiconductor fabrication apparatus 200 proceeds as follows. A plate 90 is located on the FOUP index 210, and the FOUP 290 is put over the plate. The plate 90 moves forward to open the door of the FOUP 290. Wafers in the FOUP 290 are unloaded by the first transfer device 220 and the wafers are transferred to the second transfer device 230. The second transfer device 230 first unloads the finished wafers in the processing chamber 240 and then loads other wafers to be processed into the processing chamber 240. In order to load and unload wafers to the FOUP 290 during the process, the FOUP index 210 has a plate 90 which may be moved forward and backward on the FOUP index 210, and guard pins 310.

The FOUP 290 has two doors 300 (refer to FIGS. 8A and 8B) including springs 360 that enable the doors to rotate, enabling the doors thus to be opened and shut. When the plate 90 moves forward (to the left in FIG. 8B), the guard pins 310 fixed at the front of the plate contact with both edges of the doors to thereby open the doors. When the plate 90 moves backward (to the right in FIG. 8B), because of the restoring force of the springs 360, the doors 300 are closed. The doors typically are folding types.

Figure 9:
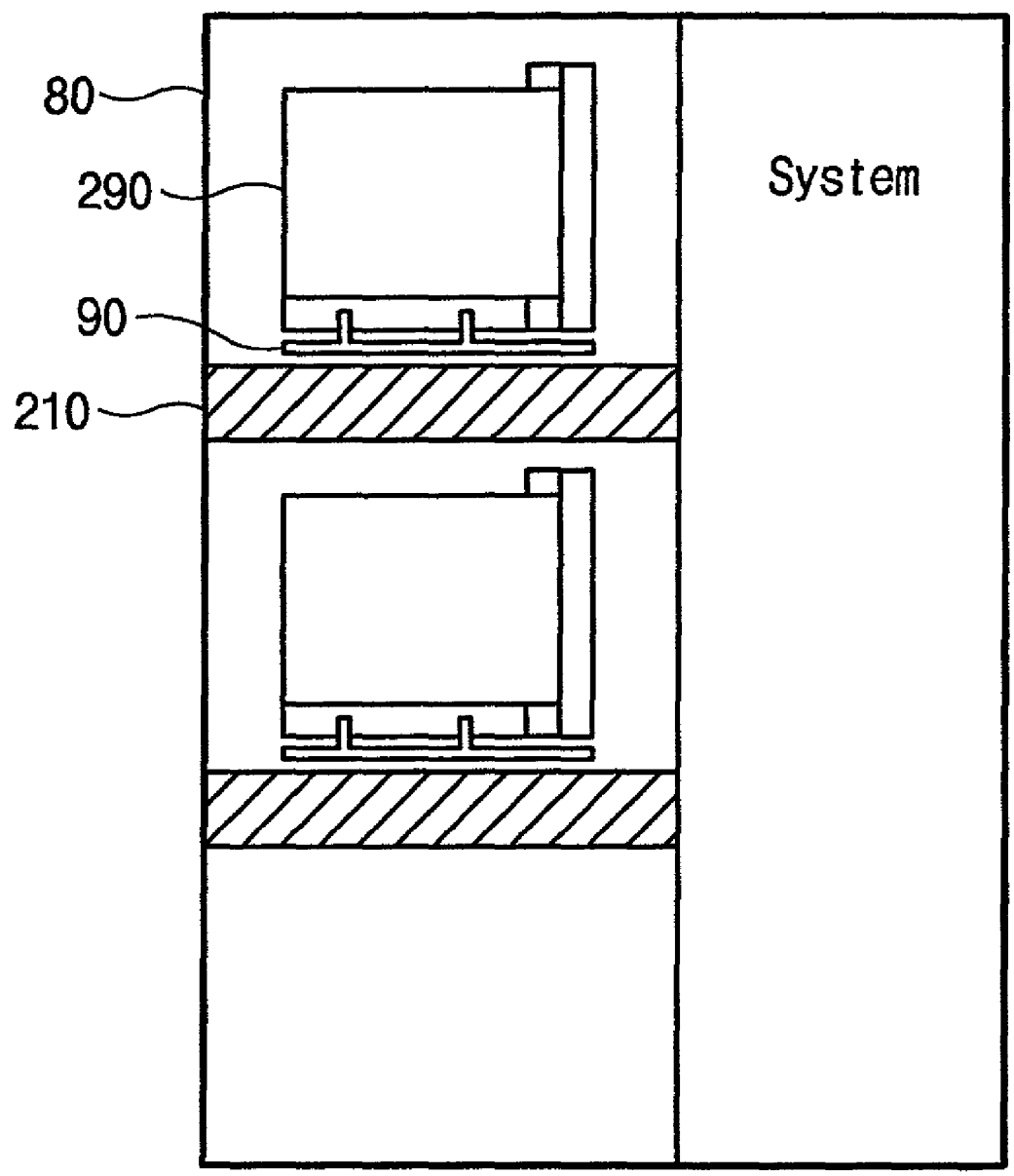
FIG. 9 is a diagram of a side view of a semiconductor fabrication apparatus having vertically stacked FOUP indexes.

Referring to FIG. 9, in the semiconductor fabrication apparatus of the present invention, the door is a folding type door and the first transfer device can move vertically. The FOUP 210 indexes can be vertically stacked to realize many advantages in space utilization and air eddy reduction. Because a FOUP index is located in a semiconductor fabrication apparatus in the apparatus installation area, it is possible to decrease working area size and remove eddies of air above and below a conventional FOUP index in a working area. Also, dead space between adjacent semiconductor fabrication apparatus is eliminated or substantially minimized. Thus, the present apparatus improves the environment and the area efficiency in wafer fabrication. The process can be further simplified because of the transfer device of the present invention.

A person skilled in the art will be able to practice the disclosed apparatus in view of the description present in this document, which is to be taken as a whole. This invention may, however, be embodied in different forms and should not be construed as limited to the embodiments set forth herein. Rather, these embodiments are provided so that this disclosure will be thorough and complete, and will fully convey the scope of the invention to those skilled in the art. Numerous details have been set forth in order to provide a more thorough understanding of the invention. In other instances, well-known features have not been described in detail in order not to obscure unnecessarily the invention.

While the apparatus has been disclosed in its preferred form, the specific embodiments thereof as disclosed and illustrated herein are not to be considered in a limiting sense. Indeed, it should be readily apparent to those skilled in the art in view of the present description that the invention can be modified in numerous ways. The inventor regards the subject matter of the invention to include all combinations and sub-combinations of the various elements, features, functions and/or properties disclosed herein.

What is claimed is:

1. A semiconductor fabrication apparatus comprising:
   an engineering front open unified pod (FOUP) index on which a FOUP can be manually placed, the engineering FOUP index including a plate, the FOUP including two doors having elastic bodies coupled thereto, the elastic bodies adapted to permit the doors to rotate open and shut;
   a first front open unified pod (FOUP) index configured to receive the FOUP directly from a working area that is adjacent to the semiconductor fabrication apparatus, the first FOUP index structured so as not to protrude from the semiconductor fabrication apparatus into the working area, the first FOUP index including guard pins for contacting the edges of the doors when the plate moves forward;
   wafer processing chambers;
   a first wafer transfer device disposed adjacent to the first FOUP index; and
   a second wafer transfer device disposed adjacent to the first wafer transfer device and adjacent to at least one of the wafer processing chambers, wherein the first wafer transfer device is adapted to transfer wafers between the first FOUP index and the second wafer transfer device, and wherein the second wafer transfer device is adapted to transfer wafers between the first wafer transfer device and the at least one of the wafer processing chambers.

2. The apparatus of claim 1, wherein each door is a folding type door adapted to be automatically opened and closed by contact of a guard pin with the door.

3. The apparatus of claim 1, wherein each elastic body is a spring having restoring force with respect to rotation of a door.

4. In a clean room which is divided into a working area and an apparatus installation area, a semiconductor fabrication apparatus installed in the apparatus installation area, the fabrication apparatus comprising:
   a first front open unified pod (FOUP) index configured to receive a FOUP directly from the working area;
   an engineering FOUP index on which the FOUP can be manually placed, the engineering FOUP index including a plate, the FOUP including two doors having elastic bodies coupled thereto, said elastic bodies adapted to permit the doors to rotate open and shut, and wherein the first FOUP index includes guard pins for contacting the edges of the doors when the plate moves forward;
   wafer processing chambers;
   a first wafer transfer device disposed adjacent to the first FOUP index; and
   a second wafer transfer device disposed adjacent to the first wafer transfer device and adjacent to at least one of the wafer processing chambers.

5. The apparatus of claim 4, wherein each door is a folding type door adapted to be automatically opened and closed by contact of a guard pin with the door.

6. The apparatus of claim 4, wherein each elastic body is a spring having restoring force with respect to rotation of a door.

* * * * *